United States Patent
Burrows et al.

(10) Patent No.: US 8,466,455 B2
(45) Date of Patent: Jun. 18, 2013

(54) DEVICE STRUCTURE

(75) Inventors: Paul E. Burrows, Kennewick, WA (US); Michael Stuart Weaver, Princeton, NJ (US); Vadim Adamovich, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 127 days.

(21) Appl. No.: 12/881,851

(22) Filed: Sep. 14, 2010

(65) Prior Publication Data

US 2011/0062462 A1    Mar. 17, 2011

Related U.S. Application Data

(60) Provisional application No. 61/243,316, filed on Sep. 17, 2009.

(51) Int. Cl.
*H01L 33/00* (2010.01)

(52) U.S. Cl.
USPC ........ 257/40; 257/88; 257/103; 257/E51.022; 438/99; 438/22

(58) Field of Classification Search
USPC .......................................................... 257/40
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |

(Continued)

OTHER PUBLICATIONS

U.S. Appl. No. 61/243,316, filed Sep. 17, 2009.

(Continued)

*Primary Examiner* — Jerome Jackson, Jr.
(74) *Attorney, Agent, or Firm* — Sterne, Kessler, Goldstein & Fox PLLC

(57) ABSTRACT

Organic light emitting devices are provided having multiple subpixels. An organic spacer layer is provided in at least one subpixel to protect the emissive layer of the at least one subpixel from overspray due to the deposition of a different emissive layer in a nearby subpixel. More generally, a first device is provided, where the first device comprises a multicolor organic light emitting device. The first device may be the multicolor organic device itself. Or, the first device may be a larger device, such as a consumer device, that includes one or many of the multicolor organic devices. The multicolor organic light emitting, device further comprises multiple subpixels. In the most general case, there are at least a first subpixel and a second subpixel.

15 Claims, 9 Drawing Sheets

U.S. PATENT DOCUMENTS

| | | |
|---|---|---|
| 7,404,862 B2 | 7/2008 | Shtein et al. |
| 7,431,968 B1 | 10/2008 | Shtein et al. |
| 8,053,770 B2 * | 11/2011 | D'Andrade et al. ............ 257/40 |
| 2003/0230980 A1 | 12/2003 | Forrest et al. |
| 2004/0174116 A1 | 9/2004 | Lu et al. |
| 2005/0087131 A1 | 4/2005 | Shtein et al. |
| 2008/0214069 A1 | 9/2008 | Kawanishi et al. |
| 2008/0311296 A1 | 12/2008 | Shtein et al. |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

* cited by examiner

DEVICE STRUCTURE

This application claims priority to U.S. Patent Application 61/243,316, filed Sep. 17, 2009, the disclosure of which is hereby expressly incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF INVENTION

The present invention relates to organic semiconductor devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

More details on OLEDs, and the definitions described above, can be found in U.S. Pat. No. 7,279,704, which is incorporated herein by reference in its entirety.

SUMMARY OF THE INVENTION

Organic light emitting devices are provided having multiple subpixels. An organic spacer layer is provided in at least one subpixel to protect the emissive layer of the at least one subpixel from overspray due to the deposition of a different emissive layer in a nearby subpixel.

More generally, a first device is provided, where the first device comprises a multicolor organic light emitting device. The first device may be the multicolor organic device itself. Or, the first device may be a larger device, such as a consumer device, that includes one or many of the multicolor organic devices.

The multicolor organic light emitting device further comprises multiple subpixels. In the most general case, there are at least a first subpixel and a second subpixel.

The first subpixel further includes a first electrode of the first subpixel and a second electrode of the first subpixel. An emissive layer of the first subpixel is disposed between the first electrode of the first subpixel and the second electrode of the first subpixel. The emissive layer of the first subpixel further includes a first organic emitting material having a first emissive spectrum with a first peak in the visible spectrum. A first overspray layer of the first subpixel is disposed between the first electrode of the first subpixel and the second electrode of the first subpixel. The first overspray layer of the first subpixel further includes a second organic emitting material, different from the first organic emitting material. The second organic emitting material has a second emissive spectrum with a second peak in the visible spectrum. A first organic spacer layer of the first subpixel is disposed between first emissive layer of the first subpixel and the second overspray layer of the first subpixel.

The second subpixel further includes a first electrode of the second subpixel and a second electrode of the second subpixel. A first overspray layer of the second subpixel is disposed between the first electrode of the second subpixel and the second electrode of the second subpixel. The first overspray layer of the second subpixel further includes the first organic emitting material. An emissive layer of the second subpixel is disposed between the first electrode of the second subpixel and the second electrode of the second subpixel. The emissive layer of the second subpixel further includes the second organic emitting material.

A spacer layer may protect an emissive layer from a subsequently deposited overspray layer, from a previously deposited overspray layer, or both.

The multicolor organic light emitting device may comprise more than two subpixels, with three subpixels being preferred. Each of the subpixels may have its own emissive layer with its own distinct emitting material. Overspray may occur when each emissive layer is deposited, resulting in multiple overspray layers in nearby subpixels. Thus, each subpixel may have multiple overspray layers, which may be above, below, or both above and below the emissive layer of a particular subpixel. Spacer layers may be used to separate the emissive layer of one or more of the subpixels from one or more of the overspray layers.

Preferably, each subpixel is separately addressable.

Each subpixel may include various layers common to organic light emitting devices, in addition to the emissive, spacer and overspray layers specifically described above. Examples of such layers are hole transport layers, electron transport layers, and others.

Where there are three subpixels with their own emitting materials, it is preferred that the first emitting material has a peak in its emissive spectrum between 400 and 500 nm, the second emitting material has a peak in its emissive spectrum between 500 and 600 nm, and the third emitting material has a peak in its emissive spectrum between 600 and 700 nm. This should allow for a blue-green-red multicolor pixel.

Methods of fabricating devices are also provided.

In one embodiment, a method of depositing a first device comprising a multi-color organic light emitting device having first and second subpixels is provided. A first electrode of the first subpixel, and a first electrode of the second subpixel are provided. Several layers are deposited, in order, over the first electrode of the first subpixel and the first electrode of the second subpixel. These layers are:

(1) a layer comprising a first emitting material having an emissive spectrum with a first peak in the visible spectrum, the layer being deposited via organic vapor jet deposition with the jet positioned such that a first emissive layer is formed in the first subpixel, and a first overspray layer is formed in the second subpixel;

(2) a first blocking layer over at least one of the first and second subpixels; and (3) a layer comprising a second emitting material having an emissive spectrum with a second peak in the visible spectrum, different from the first peak, the layer being deposited via organic vapor jet deposition with the jet positioned such that a second emissive layer is formed in the second subpixel, and a second overspray layer is formed in the first subpixel.

A second electrode is deposited over the layer comprising a second emitting material.

The method may be used to deposit multi-color organic light emitting devices having more than two subpixels. For example, there may be first, second and third subpixels, and the method may further include providing a first electrode of the third subpixel in addition to the first electrode of the first subpixel, and the first electrode of the second subpixel. The deposition may be, in order, over the first electrode of the first subpixel, the first electrode of the second subpixel, and the first electrode of the third subpixel. During deposition of the layer comprising the first emitting material, the first overspray layer may also be formed in the third subpixel. During deposition of the layer comprising a second emitting material, the second overspray layer may also be formed in the third subpixel. The deposition may further comprise depositing, in order and after depositing the layer comprising a second emitting material and before depositing the second electrode:

(4) a second blocking layer in the second subpixel; and (5) a layer comprising a third emitting material having an emissive spectrum with a third peak in the visible spectrum, different from the first and second peaks, the jet being positioned such that a third emissive layer is formed in the third subpixel, and a third overspray layer is formed in the first and second subpixels.

Each of the layers comprising the first emitting material or the second emitting material are preferably deposited via organic vapor jet deposition.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
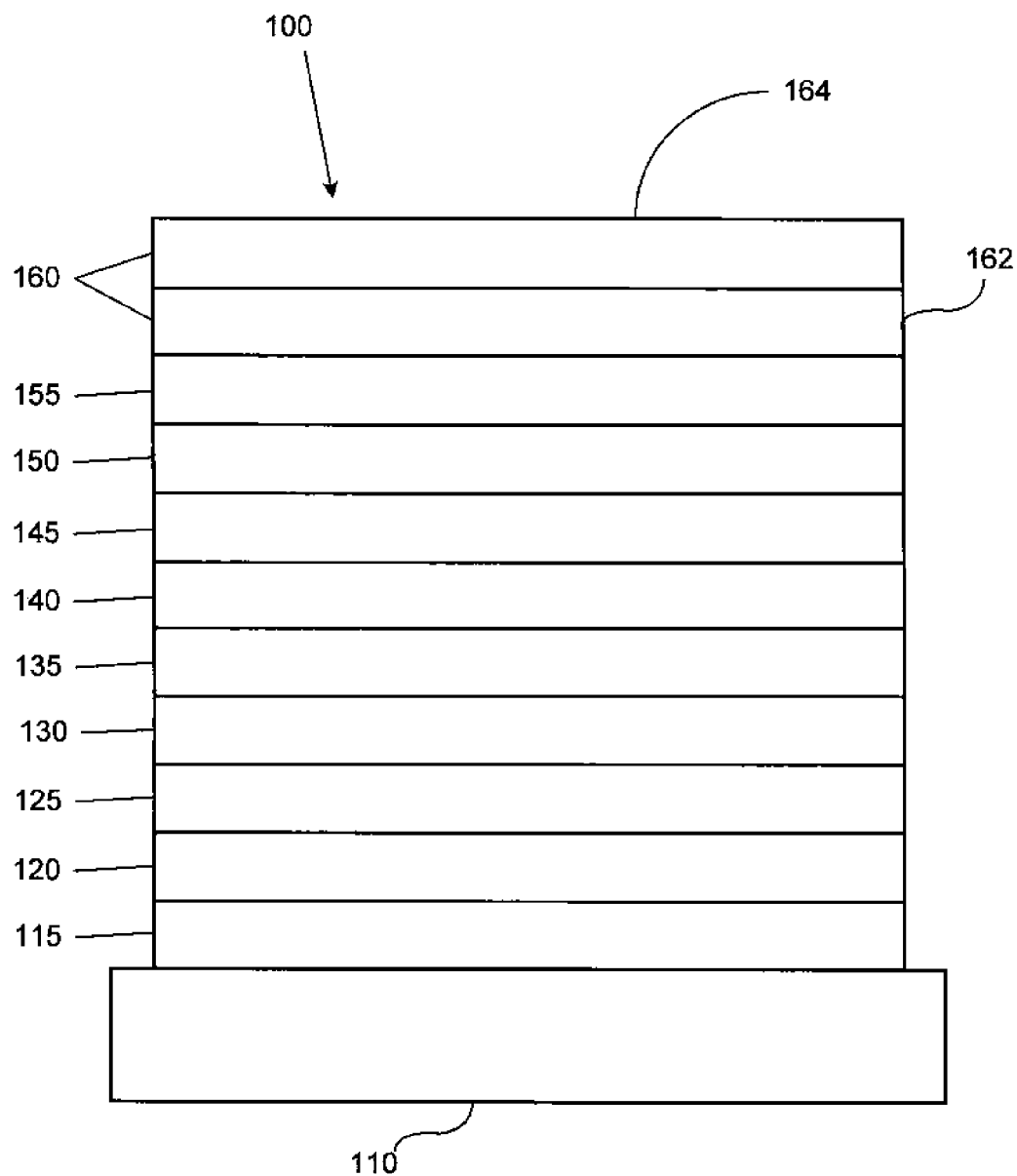
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_{4}$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
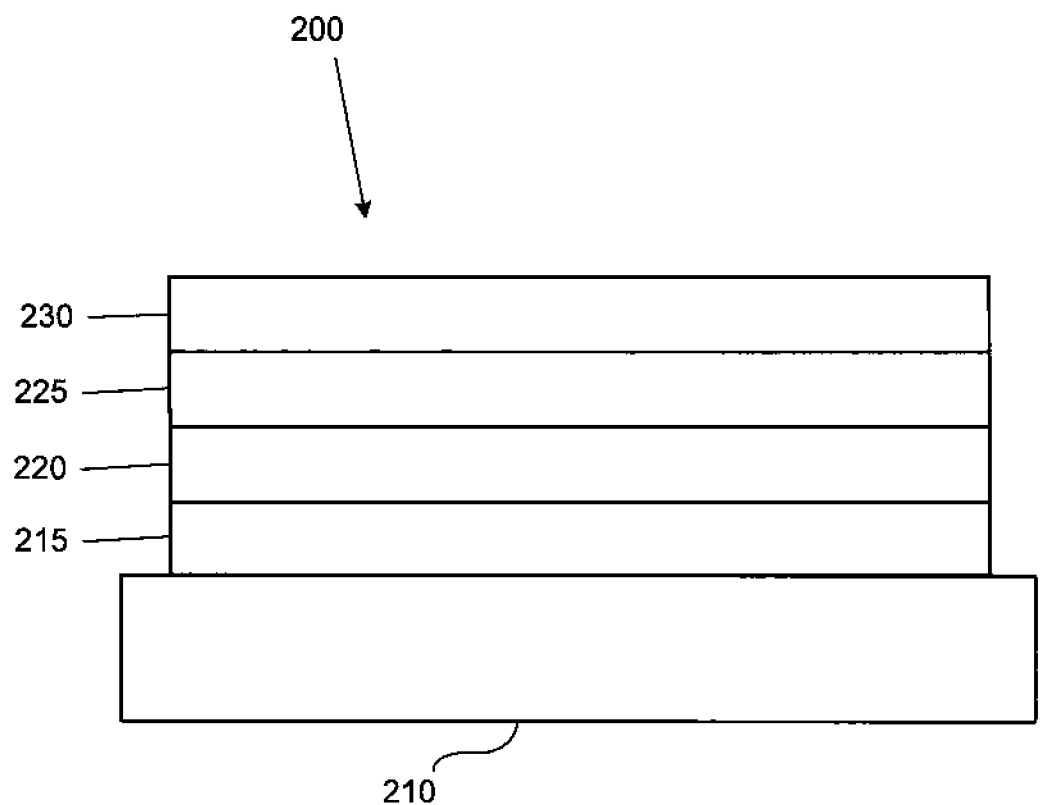
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The general principle of OVJP has been described in U.S. Pat. No. 7,404,862, U.S. patent application Ser. Nos. 10/690,704, 10/233,470, 12/175,641, 12/034,683 and CIP application docket No. 10020/21702, all of which are incorporated by reference.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Organic vapor jet printing (OVJP) offers "maskless" deposition of three-color (or more) organic light emitting displays by printing patterns of emitting materials, such as adjacent lines, on blanket-deposited transport and blocking layers. Ultimately, all layers might be printed using OVJP. An OVJP system deposits organic materials from a nozzle such that almost all of the material deposits on the substrate immediately below the nozzle.

It is believed that in any maskless vapor deposition scheme, a small amount of material diffuses laterally away from the region where it is intended to be deposited, resulting in "overspray." While various improvements may be made to reduce overspray, it is believed that at least sub-monolayer contamination outside of the intentional printed area is likely with maskless vapor deposition methods. There are various ways in which even a very small amount of such contamination can adversely affect the pixel performance. For example, if less than one monolayer of red dopant is deposited between the transport layers and luminescent layer of a blue pixel because of overspray from an adjacent or nearby red pixel, it is expected that there may be energy transfer to the lower energy red emitting material, as well as charge trapping effects, which may result in significant reduction of the efficiency of the blue pixel, and contamination of the blue spectrum with red light.

The effect of overspray may be minimized by depositing the red, blue and green pixels (often referred to as subpixels) in a particular order with organic spacer layers added to isolate the expected small amounts of contamination to regions of the device where they will have less effect. The overspray may still be present, but it is separated from where it can do the most harm by an organic spacer layer. Organic spacer layers are preferably incorporated in positions in adjacent subpixels to isolate the recombination region of a subpixel from the effects of overspray during deposition of the emissive layers of adjacent subpixels.

The preferred deposition order for various emissive layers may be affected by a number of factors. Two particular preferred deposition orders, in order over the anode, are blue-green-red for phosphorescent materials and green-blue-red for fluorescent materials. However, other deposition orders may be used, and it is expected that a spacer layer may be productively incorporated into a wide variety of deposition orders.

Organic light emitting devices are provided having multiple subpixels. An organic spacer layer protects the emissive layer of at least one subpixel from overspray due to the deposition of a different emissive layer in a nearby subpixel.

More generally, a first device is provided, where the first device comprises a multicolor organic light emitting device. The first device may be the multicolor organic device itself. Or, the first device may be a larger device, such as a consumer device, that includes one or many of the multicolor organic devices.

The multicolor organic light emitting device further comprises multiple subpixels. In the most general case, there are at least a first and second subpixel.

The first subpixel further includes a first electrode of the first subpixel and a second electrode of the first subpixel. An emissive layer of the first subpixel is disposed between the first electrode of the first subpixel and the second electrode of the first subpixel. The emissive layer of the first subpixel further includes a first organic emitting material having a first emissive spectrum with a first peak in the visible spectrum. A first overspray layer of the first subpixel is disposed between the first electrode of the first subpixel and the second electrode of the first subpixel. The first overspray layer of the first subpixel further includes a second organic emitting material, different from the first organic emitting material. The second organic emitting material has a second emissive spectrum with a second peak in the visible spectrum. A first organic spacer layer of the first subpixel is disposed between first emissive layer of the first subpixel and the second overspray layer of the first subpixel.

The second subpixel further includes a first electrode of the second subpixel and a second electrode of the second subpixel. A first overspray layer of the second subpixel is disposed between the first electrode of the second subpixel and the second electrode of the second subpixel. The first overspray layer of the second subpixel further includes the first organic emitting material. An emissive layer of the second subpixel is disposed between the first electrode of the second subpixel and the second electrode of the second subpixel. The emissive layer of the second subpixel further includes the second organic emitting material.

The description of the previous two paragraphs is general enough that the first organic spacer of the first subpixel may protect the first emissive layer of the first subpixel from overspray disposed above or disposed below the first emissive layer.

As used herein, an "overspray layer" is the byproduct, generally undesired, near a patterned feature deposited by certain deposition techniques. Organic Vapor Jet Printing is a technique that may result in an overspray layer, because material is generally deposited under the jet nozzle, perhaps with some spread, but there are also generally molecules that may not stick to the substrate on the first impact or that re-evaporate, and end up elsewhere on the substrate as "overspray." An overspray layer generally has a thickness much thinner than that of the patterned feature. It is expected that the thickness of an overspray layer may be less than a monolayer in many situations. Because an overspray layer is the byproduct of the deposition of an adjacent layer, the vertical position in a stack of the overspray layer is limited to places that were exposed when the adjacent layer was deposited. For example, in a multicolor device having three subpixels and a common hole transport layer, the overspray from patterned layers deposited via OVJP over the common HTL will similarly be over the HTL.

As used herein, a "layer" without the "overspray" adjective is generally a deliberately deposited layer that serves a purpose in the device architecture. Physically, in the context of the OVJP deposition technique, this means that such a layer is generally thicker than 10 monolayers, although some deliberately deposited layers can be quite thin, such as injection layers. The "overspray layer" is the deposition of material in the region where deposition is not targeted, but which happens nevertheless when material is deposited elsewhere in a targeted region. An "overspray layer" may be less than a monolayer thick, and would not be expected to be more than a few monolayers thick, but this can still significantly adversely affect performance.

One context in which overspray occurs is when an OLED having three subpixels with different colors is fabricated, and the emissive layers are patterned via OVJP. When printing the light emitting layer of an OLED, there is very likely a small amount of overspray. This can cause color contamination of adjacent pixels and a loss of efficiency, although there may be a small increase in efficiency. These issues are most prevalent when the overspray deposits a longer wavelength emitter in the recombination region of an adjacent subpixel, but can also occur in other contexts.

As used herein, an "organic spacer" layer is a layer that separates a patterned emissive layer from the overspray of an adjacent patterned emissive layer. As such, the fabrication sequence would involve the deposition of spacer layers in between the patterning steps used. The organic spacer layer may be an unpatterned layer, or it may be patterned. "Organic spacer" may be abbreviated herein to "spacer." Where the term "spacer" is used, it is understood that the spacer layer is made of organic material(s).

Blocking layers are known, and are typically placed in a device in contact with an emissive layer. In fact, it is preferred that the spacer layers disclosed herein are also in contact with an emissive layer, and have blocking functionality, and many of the preferred choices for the material of a spacer layer are the same as those preferred for a blocking layer. However, it is believed that one of skill in the art who was not guided by this disclosure with respect to the effects of overspray would, when fabricating a multicolor pixel, deposit the patterned emissive layers at the same time or in steps immediately subsequent to each other. Any blocking layer deposited prior to an emissive layer would therefore also likely be deposited prior to the overspray from the emissive layers of adjacent subpixels, and would not provide protection from overspray. Similarly, any blocking layer deposited after an emissive layer would be deposited after the overspray from the emissive layers of adjacent subpixels. The blocking layer may be intended as a "common" hole or electron blocking layer across all subpixels, which is desirable in many contexts to reduce the number of materials that must be deposited, as well as the number of layers that must be patterned. In this situation, the blocking layer would be deposited either before all emissive layers or after all emissive layers, and could not be between an emissive layer of one pixel and an overspray layer from the emissive layer of an adjacent pixel. The organic spacer layers as disclosed herein are therefore fundamentally different from a blocking layer in that a spacer layer specifically isolates an emissive layer from an overspray layer that contains the emitting material of a nearby emissive layer.

It may also be desirable to protect emissive layers from exposure to materials in the non-emissive layers of the device, whether those materials are deliberately incorporated into a particular subpixel, or whether those materials are present due to overspray from depositing the non-emissive layers of nearby devices. While layers providing such protection may be incorporated into embodiments of the invention, such a layer would not be considered a "spacer" layer as the term is defined herein, because it does not separate a patterned emissive layer from the overspray of an adjacent patterned emissive layer.

Emitting materials are possibly damaging as impurities when they are present in the emissive layers of devices that use different emitting materials. They can cause color contamination, and significant efficiency loss. But there are many reasons to want to use a particular emitting material in a device architecture. For example, the most desirable red emitting material in terms of efficiency, lifetime, brightness, CIE coordinates, etc. may be very damaging if present as an impurity in a green emitting device that uses the most desirable green emitting material.

"Spacer" layers may be deposited by any suitable technique. Where the emissive layers are deposited by OVJP, it may be preferable to also use OVJP for the spacer layers, particularly where a blanket spacer layer is not desired. Thus, "spacer" layers may themselves have overspray. However, the criteria for selecting a material for the spacer layer are different for those used to select an emitting material. Preferably, the material(s) of a spacer layer are selected such that any overspray would detract from the performance of adjacent devices significantly less than the material in an overspray layer being isolated by the spacer layer. Selecting materials commonly used in blocking layers is one way to achieve this goal. Also, spacer layers may be blanket deposited. Methods other than OVJP may be used to deposit spacer layers, such as VTE or any other suitable method.

As used herein, an "emissive" layer is the layer of a device that emits light when the device is run as intended. An "emitting" material is the material in the emissive layer that emits light when the device is run as intended. There are many organic materials that may be emitting in some contexts but not in others. For example, iridium tris phenylpyridene is a material that emits green light via phosphorescence, and which may be used as the emitting material in the emissive layer of a green device. However, it is also known to use iridium tris phenylpyridene as a hole injection layer in a device, in which case it is not an "emitting" material as the term is used herein. If a material is intended to emit light anywhere in the device architecture, including in a nearby subpixel, it is considered an "emitting" material as the term is used herein. Where an overspray layer is described as containing an "emitting" material; that material will generally not contribute significantly to the emission of the device where it is present as overspray, but will rather be considered "emitting" due to its function in a nearby device where deposition of the emitting material was targeted.

In one embodiment, the first subpixel comprises the following layers disposed over one another, in order: the first electrode of the first subpixel, the emissive layer of the first subpixel; the first spacer layer of the first subpixel; the first overspray layer of the first subpixel; and the second electrode of the first subpixel disposed over the first overspray layer of the first subpixel. The second subpixel comprises the following layers disposed over one another, in order: the first electrode of the second subpixel; the first overspray layer of the second subpixel; the emissive layer of the second subpixel; the second electrode of the second subpixel. In this embodiment, a spacer layer protects an emissive layer in the first subpixel from an overspray layer disposed above the emissive layer.

In one embodiment, the multicolor device has the structure specified in the previous paragraph, and in addition, in the first subpixel, the first spacer layer of the first subpixel is in contact with the emissive layer of the first subpixel; and the first overspray layer of the first subpixel is in contact with the first spacer layer of the first subpixel.

In one embodiment, the first subpixel comprises the following layers disposed over one another, in order: the first electrode of the first subpixel; the first overspray layer of the first subpixel; the first spacer layer of the first subpixel; the emissive layer of the first subpixel; the second electrode of the first subpixel. The second subpixel comprises the following layers disposed over one another, in order: the first electrode of the second subpixel; the emissive layer of the second subpixel; the first overspray layer of the second subpixel; the second electrode of the second subpixel. In this embodiment, a spacer layer protects an emissive layer in the first subpixel from an overspray layer disposed below the emissive layer.

In one embodiment, the multicolor device has the structure specified in the previous paragraph, and in addition, in the first subpixel, the first spacer layer of the first subpixel is in contact with the first overspray layer of the first subpixel; and the emissive layer of the first subpixel is in contact with the first spacer layer.

Multicolor devices having three subpixels are preferred in many embodiments.

In one embodiment, the multicolor device has at least three subpixels. In the first subpixel, a spacer layer protects an emissive layer from subsequently deposited first and second overspray layers. Also, in the second subpixel, a spacer layer protects an emissive layer from a subsequently deposited second overspray layer. Specifically, the first subpixel further comprises the following layers, disposed over one another in order: the first electrode of the first subpixel; the emissive layer of the first subpixel; the first organic spacer layer of the first subpixel; the first overspray layer of the first subpixel; a second overspray layer of the first subpixel, and the second electrode of the first subpixel. The second subpixel further comprises the following layers, disposed over one another in order: the first electrode of the second subpixel; the first overspray layer of the second subpixel; the emissive layer of the second subpixel; the first organic spacer layer of the second subpixel; a second overspray layer of the second subpixel, and the second electrode of the second subpixel. The third subpixel further comprises the following layers, disposed over one another in order: a first electrode of the third subpixel; a first overspray layer of the third subpixel; a second overspray layer of the third subpixel, an emissive layer of the third subpixel; and a second electrode of the third subpixel. A first organic emitting material is included in the emissive layer of the first subpixel, the first overspray layer of the second subpixel, and the first overspray layer of the third subpixel. A second organic emitting material is included in the first overspray layer of the first subpixel, the emissive layer of the second subpixel, and the second overspray layer of the third subpixel. A third organic emitting material is included in the second overspray layer of the first subpixel, the second overspray layer of the second subpixel, and emissive layer of the third subpixel. The first, second and third emitting materials are different, and have first, second and third emissive peaks, respectively, in the visible spectrum.

The embodiment of the preceding paragraph is particularly useful where the first emitting material emits blue light, the second emitting material emits green light, and the third emitting material emits red light. This means that the first emissive peak (the peak of the first emitting material) is between 400 and 500 nm, the second emissive peak (the peak of the second emitting material) is between 500 and 600 nm, and the third emissive peak (the peak of the third emitting material) is between 600 and 700 nm. As a result, the blue emitting material in the first subpixel is protected by an organic spacer layer from overspray layers of subsequently deposited green and red emitting materials. The green emitting material in the second subpixel is protected above by an organic spacer layers from a subsequently deposited overspray layer of red emitting material. The red emitting material in the third subpixel is not necessarily protected by an organic spacer layer because many devices having red emissive layers are not significantly adversely affected by blue or green emitting impurities in the amount expected in an overspray layer.

In one embodiment, the multicolor device has at least three subpixels. This embodiment is similar to that described in the preceding two paragraphs. The first and third subpixels have the same structure as described in the preceding paragraph. The second subpixel has organic spacer layers both above and below its emissive layer, to protect from overspray above and below the emissive layer. Specifically, the second subpixel further comprises the following layers, in order: the first electrode of the second subpixel; the first overspray layer of the second subpixel; the first organic spacer layer of the second subpixel; the emissive layer of the second subpixel; the second organic spacer layer of the second subpixel; the second overspray layer of the second subpixel; and the second electrode of the second subpixel. The emissive layers and overspray layers include emitting materials as described for the embodiment in the preceding paragraph.

The embodiment of the preceding paragraph is particularly useful where the first emitting material emits blue light, the second emitting material emits green light, and the third emitting material emits red light, for reasons similar to those described for the preceding embodiment. The additional organic spacer layer in the second subpixel between the green emitting layer and the underlying blue overspray layer might also improve device performance, most likely by reducing hole trapping.

Any contamination, for example via overspray, by an emitting material having a lower triplet energy (i.e., higher wavelength), is likely to cause significant problems in a device, because triplets may readily transfer from a higher triplet energy material to a lower triplet energy material. Thus, in a blue emissive layer, triplets on the blue emitting material are likely to transfer any red or green emitting impurities, if such impurities are present, which may result in color contamination or at least decreased blue emission. Similarly, in a green emissive layer, triplets on the green emitting material are likely to transfer any red emitting impurities, causing similar issues. It has also been observed that blue emitting contaminants may cause significant decreases in the performance of a green emissive layer. This is likely not due to triplet transfer from a green emitting molecule to a blue emitting molecule, which is not energetically favorable, but rather is likely due to holes being trapped in the deep HOMO levels of the blue emitting molecules. Similar effects are expected for singlets.

In every embodiment disclosed herein, it is preferable that each subpixel is separately addressable. For example, where there are three subpixels, it is preferably that the first, second and third subpixels are separately addressable. This may be achieved by having either (or both) of the first and second electrodes of each subpixel being separately addressable.

In any of the embodiments disclosed herein, it is preferred, and consistent with the most commonly used device structures, that the first electrodes be anodes, and the second electrodes be cathodes. Layers in addition to those specifically described may be present in the devices, such as hole transport layers, electron transport layers, and other layers. A hole transport layer is preferably disposed between the anode of a device on one hand, and the emissive and overspray layers on the other hand. Preferably, to reduce the number of patterning steps needed, the hole transport layer is common to all devices. Similarly, an electron transport layer is preferably disposed between the cathode of a device on one hand, and the emissive and overspray layers on the other hand. Preferably, to reduce the number of patterning steps needed, the electron transport layer is common to all devices.

Methods of fabricating devices are also provided.

In one embodiment, a method of depositing a first device comprising a multi-color organic light emitting device having first and second subpixels is provided. A first electrode of the first subpixel, and a first electrode of the second subpixel are provided. Several layers are deposited, in order, over the first electrode of the first subpixel and the first electrode of the second subpixel. These layers are:

(1) a layer comprising a first emitting material having an emissive spectrum with a first peak in the visible spectrum, the layer being deposited via organic vapor jet deposition with the jet positioned such that a first emissive layer is formed in the first subpixel, and a first overspray layer is formed in the second subpixel;

(2) a first blocking layer over at least one of the first and second subpixels; and (3) a layer comprising a second emitting material having an emissive spectrum with a second peak in the visible spectrum, different from the first peak, the layer being deposited via organic vapor jet deposition with the jet positioned such that a second emissive layer is formed in the second subpixel, and a second overspray layer is formed in the first subpixel.

A second electrode is deposited over the layer comprising a second emitting material.

The method may be used to deposit a multi-color organic light emitting device having more than two subpixels. For example, there may be first, second and third subpixels, and the method may further include providing a first electrode of the third subpixel in addition to the first electrode of the first subpixel, and the first electrode of the second subpixel. The deposition may be, in order, over the first electrode of the first subpixel, the first electrode of the second subpixel, and the first electrode of the third subpixel. During deposition of the layer comprising the first emitting material, the first overspray layer may also be formed in the third subpixel. During deposition of the layer comprising a second emitting material, the second overspray layer is may also be formed in the third subpixel. The deposition may further comprises depositing, in order and after depositing the layer comprising a second emitting material and before depositing the second electrode:

(4) a second blocking layer in the second subpixel; and
(5) a layer comprising a third emitting material having an emissive spectrum with a third peak in the visible spectrum, different from the first and second peaks, the jet being positioned such that a third emissive layer is formed in the third subpixel, and a third overspray layer is formed in the first and second subpixels.

Each of the layers comprising the first emitting material or the second emitting material are preferably deposited via organic vapor jet deposition.

The convention used herein to label "overspray" layers and other layers numbers the layers sequentially, with the "first" overspray layer being closest to the substrate. The numbering is specific to each subpixel. Because some overspray layers are present in some subpixels but not others (such as the subpixel where the material in question was deliberately deposited), the material of the "first" overspray layer in one subpixel may be different from the material in the "first" overspray layer of another subpixel. Generally, each overspray layer is identified as containing a particular emissive material, and it should be understood that the overspray layer was deposited at the same time, and is the byproduct of, depositing an emissive layer containing that emissive material in a nearby subpixel. So, for example, in FIG. 6, when emissive layer 648 is deposited in second subpixel 654, there is overspray in the first and third subpixels. The resultant layers are first overspray layer 628 of first subpixel 620, and second overspray layer 668 of third subpixel 660. Emissive layer 648 of second subpixel 640, first overspray layer 628 of first subpixel 620, and second overspray layer 668 of third subpixel 660 all include the emitting material of emissive layer 648.

The figures are not drawn to scale, but are rather drawn to most clearly illustrate concepts. For example, the overspray layer created when an emissive layer is deposited is expected to have a thickness that is only a small fraction of that of the emissive layer, and is expected to decrease in thickness with distance from the emissive layer. This ratio is not reflected in the figures, to make it easier for the viewer to see where the overspray layers are present.

Figure 3:
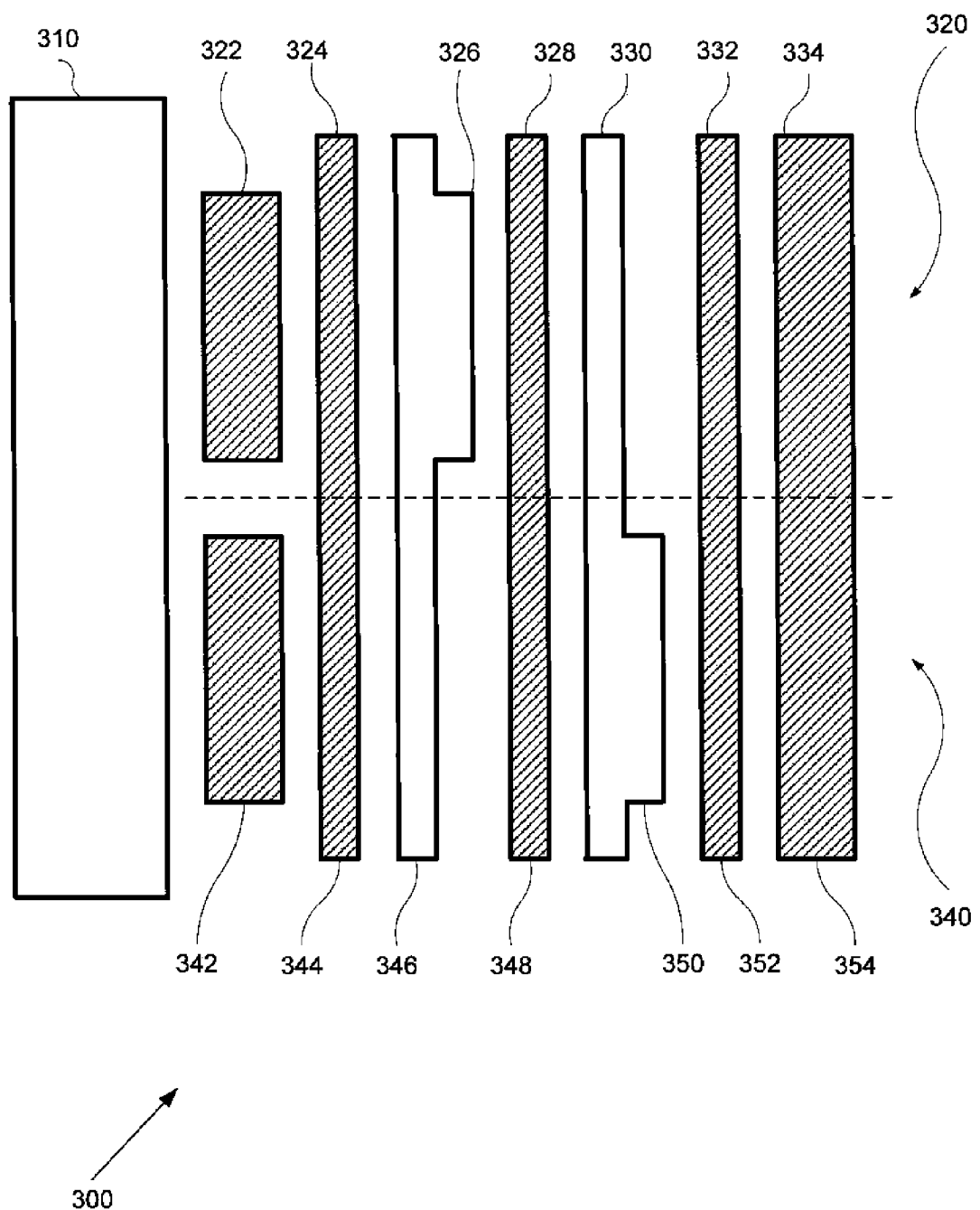
FIG. 3 shows a device having two subpixels, where a spacer layer protects the emissive layer of each subpixel from overspray from the emissive layer of the other subpixel.

FIG. 3 shows a device having two subpixels, where a spacer layer protects the emissive layer of each subpixel from overspray from the emissive layer of the other subpixel. Device 300 is fabricated on substrate 310. Device 300 has a first subpixel 320 and a second subpixel 340. A dashed line separates the subpixels.

First subpixel 320 includes a first electrode 322, a hole transport layer 324, an emissive layer 326, a first spacer layer 328, a first overspray layer 330, an electron transport layer 332, and a second electrode 334. Emissive layer 326 includes a first organic emitting material having a first emissive spectrum with a first peak in the visible spectrum.

Second subpixel 340 includes a first electrode 342, a hole transport layer 344, a first overspray layer 346, a first spacer layer 348, an emissive layer 350, an electron transport layer 352, and a second electrode 354. Emissive layer 350 includes a second organic emitting material, different from the first organic emitting material, having a second emissive spectrum with a second peak in the visible spectrum.

First overspray layer 330, which is in first subpixel 320, is due to overspray when emissive layer 350 is deposited in second subpixel 340. As a result, first overspray layer 330 includes the second organic emitting material. Similarly, first overspray layer 346, which is in second subpixel 340, is due to overspray when emissive layer 326 is deposited in first subpixel 320. As a result, first overspray layer 346 includes the first organic emitting material.

Figure 4:
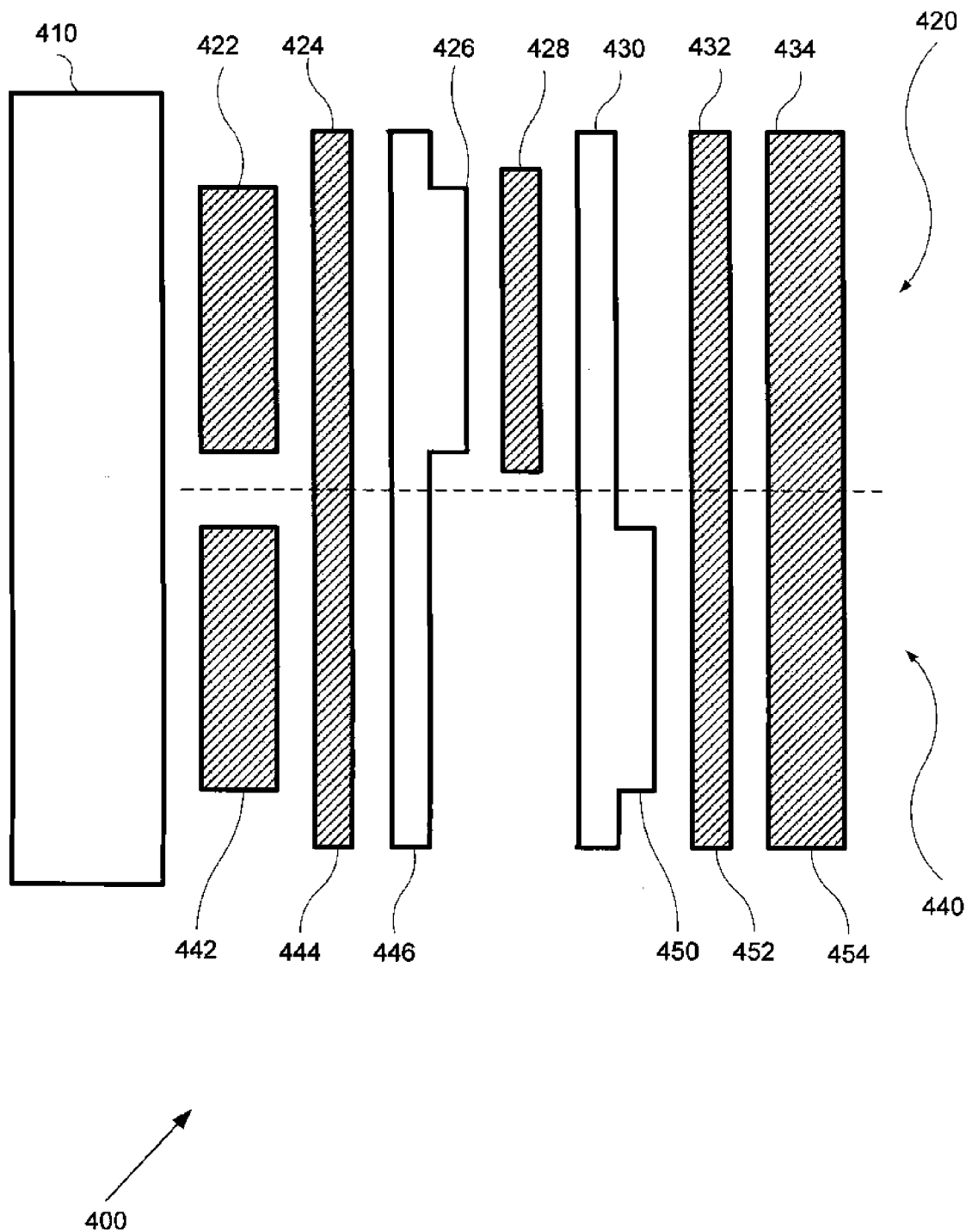
FIG. 4 shows a device having two subpixels, where a spacer layer protects the emissive layer of one subpixel from an overspray from the emissive layer of the other subpixel, where the overspray layer is disposed over the protected emissive layer.
Figure 5:
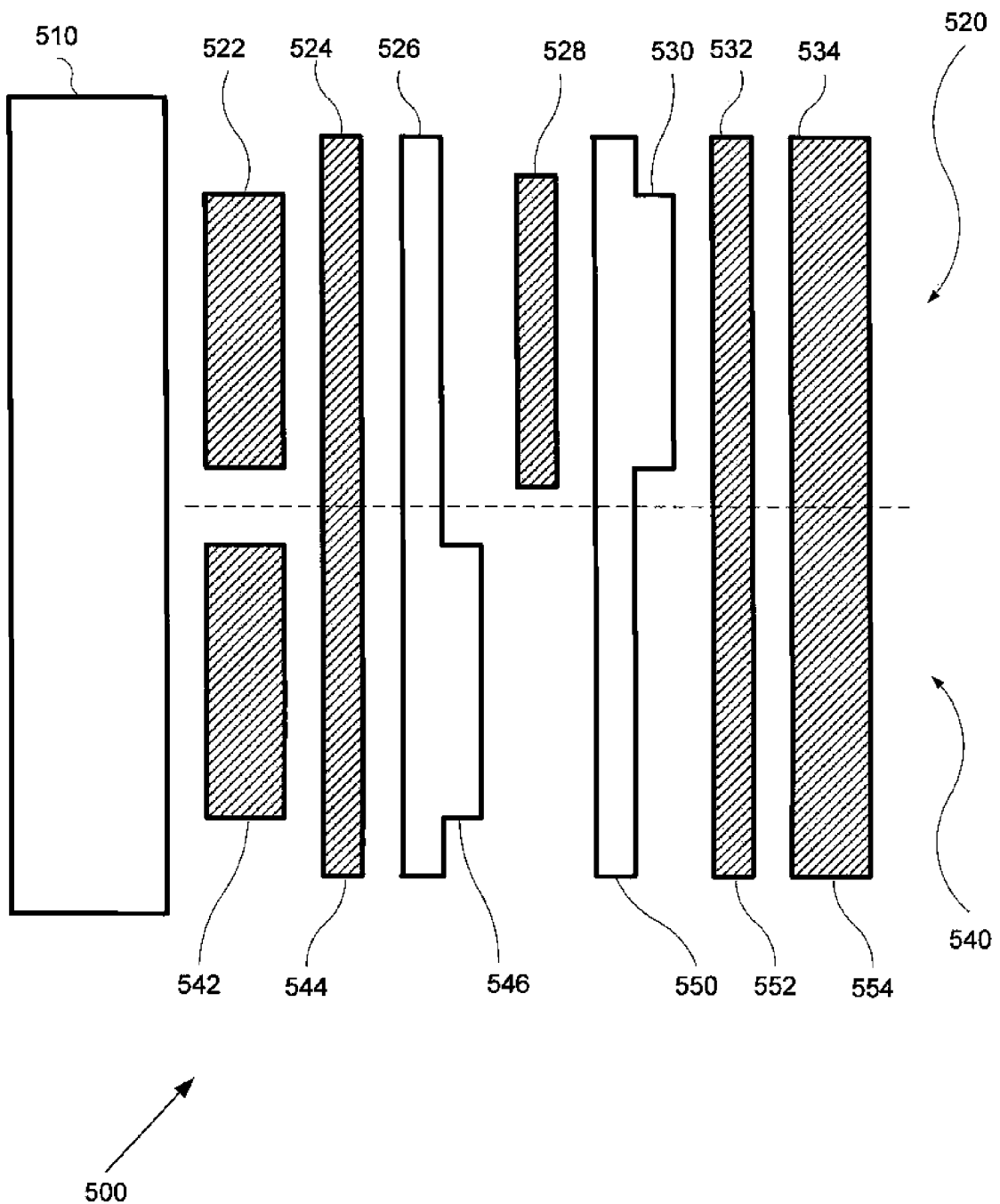
FIG. 5 shows a device having two subpixels, where a spacer layer protects the emissive layer of one subpixel from an overspray from the emissive layer of the other subpixel, where the overspray layer is disposed under the protected emissive layer.

It should be understood that figures involving devices having two subpixels, such as FIGS. 3, 4 and 5, are illustrating concepts that may be used in devices having more subpixels. For example, devices having more subpixels and more layers than those specifically illustrated in the figures are contemplated. Moreover, some of the layers, such as the electron and hole transport layers, are preferred and will be generally present, but they are not necessary to practice the use of a spacer layer to protect an emissive layer from an overspray layer as illustrated in the embodiments.

FIG. 4 shows a device having two subpixels, where a spacer layer protects the emissive layer of one subpixel from an overspray from the emissive layer of the other subpixel, where the overspray layer is disposed over the protected emissive layer. Device 400 is fabricated on substrate 410. Device 400 has a first subpixel 420 and a second subpixel 440. A dashed line separates the subpixels.

First subpixel 420 includes a first electrode 422, a hole transport layer 424, an emissive layer 426, a first spacer layer 428, a first overspray layer 430, an electron transport layer 432, and a second electrode 434. Emissive layer 426 includes a first organic emitting material having a first emissive spectrum with a first peak in the visible spectrum. Generally, where a layer is described as "including" a material, such as an emitting material, it may include other materials, such as a host material. More generally, layers may include one material, or a mixture of materials.

Second subpixel 440 includes a first electrode 442, a hole transport layer 444, a first overspray layer 446, an emissive layer 450, an electron transport layer 452, and a second electrode 454. Emissive layer 450 includes a second organic emitting material, different from the first organic emitting material, having a second emissive spectrum with a second peak in the visible spectrum.

First overspray layer 430, which is in first subpixel 420, is due to overspray when emissive layer 450 is deposited in second subpixel 440. As a result, first overspray layer 430 includes the second organic emitting material. Similarly, first overspray layer 446, which is in second subpixel 440, is due to overspray when emissive layer 426 is deposited in first subpixel 420. As a result, first overspray layer 446 includes the first organic emitting material.

In device 400, in first subpixel 420, organic spacer layer 428 protects emissive layer 426 from overspray layer 430, which is disposed over emissive layer 426. There is not similar protection from overspray in second subpixel 440. This arrangement may be most useful for situations where impurities of the second emitting material significantly degrades performance of devices that use the first emitting material, but impurities of the first emitting material does not significantly degrade performance of devices that use the second emitting material. Device 400 is similar to device 300, but is different in that both subpixels 320 and 340 of device 300 have organic spacer layers, whereas subpixel 420 but not subpixel 440 of device 400 has an organic spacer layer.

FIG. 5 shows a device having two subpixels, where a spacer layer protects the emissive layer of one subpixel from an overspray from the emissive layer of the other subpixel, where the overspray layer is disposed under the protected emissive layer. Device 500 is fabricated on substrate 510. Device 500 has a first subpixel 520 and a second subpixel 540. A dashed line separates the subpixels.

First subpixel 520 includes a first electrode 522, a hole transport layer 524, a first overspray layer 526, a first spacer layer 528, an emissive layer 530, an electron transport layer 532, and a second electrode 534. Emissive layer 530 includes a first organic emitting material having a first emissive spectrum with a first peak in the visible spectrum.

Second subpixel 540 includes a first electrode 542, a hole transport layer 544, an emissive layer 546, a first overspray layer 550, an electron transport layer 552, and a second electrode 554. Emissive layer 546 includes a second organic emitting material, different from the first organic emitting material, having a second emissive spectrum with a second peak in the visible spectrum.

First overspray layer 526, which is in first subpixel 520, is due to overspray when emissive layer 546 is deposited in second subpixel 540. As a result, first overspray layer 526 includes the second organic emitting material. Similarly, first overspray layer 550, which is in second subpixel 540, is due to overspray when emissive layer 526 is deposited in first subpixel 520. As a result, first overspray layer 546 includes the first organic emitting material.

In device 500, in first subpixel 520, organic spacer layer 528 protects emissive layer 530 from overspray layer 526, which is disposed under emissive layer 530. There is not similar protection from overspray in second subpixel 540. This arrangement may be most useful for situations where impurities of the second emitting material significantly degrades performance of devices that use the first emitting material, but impurities of the first emitting material does not significantly degrade performance of devices that use the second emitting material. Device 500 is similar to device 400, but is different in that an emissive layer is protected from an overspray layer disposed under the emissive layer in device 500, whereas an emissive layer is protected from an overspray layer disposed over the emissive layer in device 400.

Figure 6:
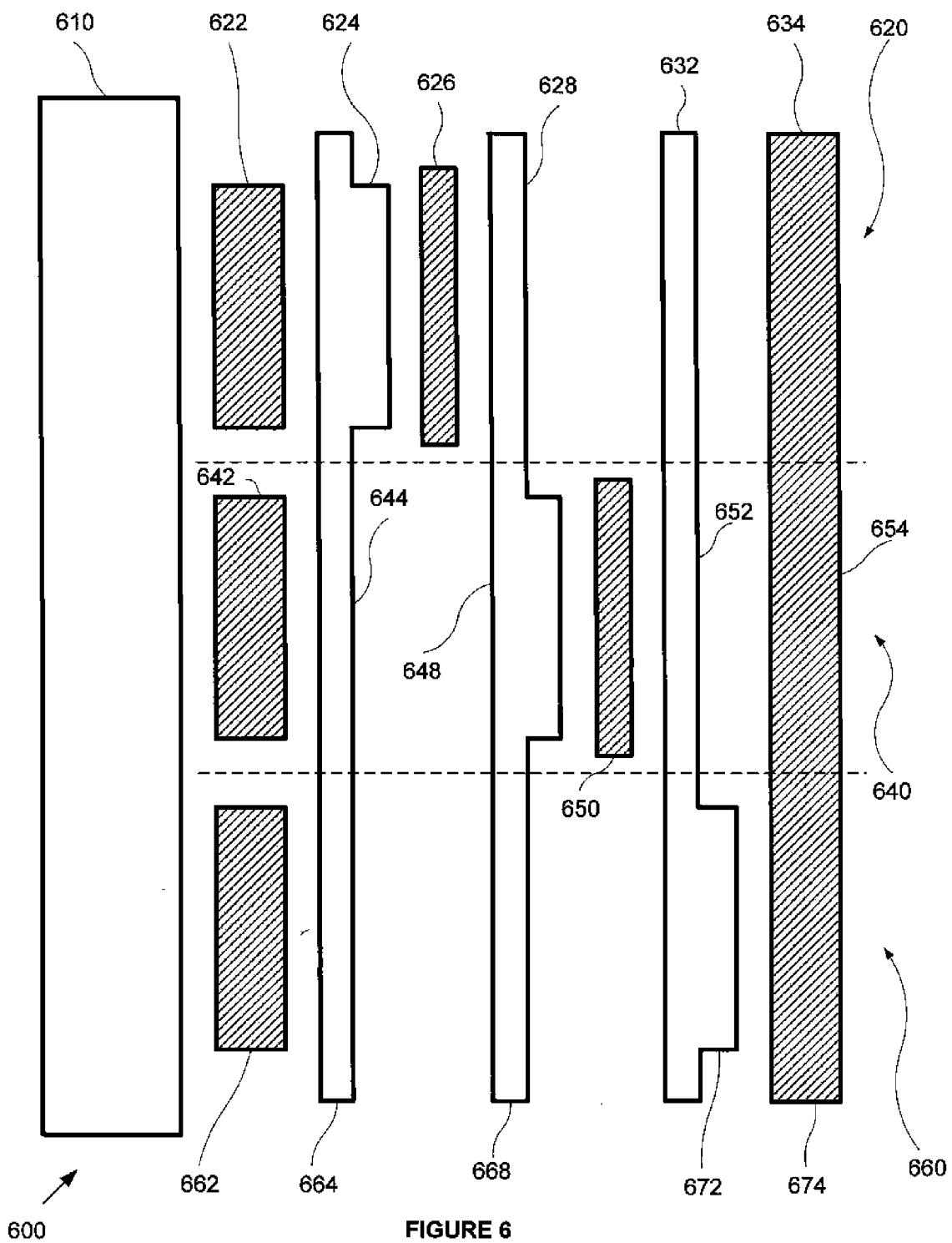
FIG. 6 shows a device having three subpixels, where two of the subpixels have organic spacer layers that protect an emissive layer from an overspray layer.

FIG. 6 shows a device having three subpixels, where two of the subpixels have organic spacer layers that protect an emissive layer from an overspray layer. In the first subpixel, an organic spacer layer protects an emissive layer from an overspray layer disposed above the emissive layer. In the second subpixel, an organic spacer layer protects an emissive layer from an overspray layer disposed above the emissive layer. Device 600 is fabricated on substrate 610. Device 600 has a first subpixel 620, a second subpixel 640, and a third subpixel 660. A dashed line separates the subpixels. In an actual device, there is likely to be some spatial separation between subpixels. Hole and electron transport layers are not specifically illustrated in FIG. 6, but it is understood that they, and other layers, may be present. The illustration of FIG. 6 focuses on the emissive layers of the subpixels, the overspray layers created when those emissive layers are deposited, and organic spacer layers that provide protection from overspray.

First subpixel 620 includes a first electrode 622, an emissive layer 624, a first organic spacer layer 626, a first overspray layer 628, a second overspray layer 632, and a second electrode 634. Emissive layer 624 includes a first organic emitting material having a first emissive spectrum with a first peak in the visible spectrum.

Second subpixel 640 includes a first electrode 642, a first overspray layer 644, an emissive layer 648, a first organic spacer layer 650, a second overspray layer 652, and a second electrode 654. Emissive layer 648 includes a second organic emitting material, different from the first organic emitting material, having a second emissive spectrum with a second peak in the visible spectrum.

Third subpixel 660 includes a first electrode 662, a first overspray layer 664, a second overspray layer 668, an emissive layer 672, and a second electrode 674. Emissive layer 668 includes a third organic emitting material, different from the first and second organic emitting materials, having a third emissive spectrum with a third peak in the visible spectrum.

First overspray layer 644 of second subpixel 640, and first overspray layer 664 of third subpixel 660, are due to overspray when emissive layer 624 is deposited in first subpixel 620, and as a result include the first organic emitting material. Similarly, first overspray layer 628 of first subpixel 620, and second overspray layer 668 of third subpixel 660, are due to overspray when emissive layer 648 is deposited in second subpixel 640, and as a result include the second organic emitting material. Similarly, second overspray layer 632 of first subpixel 620, and second overspray layer 652 of second subpixel 640, are due to overspray when emissive layer 672 is deposited in third subpixel 660, and as a result include the third organic emitting material.

In device 600, in first subpixel 620, first organic spacer layer 626 protects emissive layer 624 from first overspray layer 628 and second overspray layer 632, which are disposed over emissive layer 624. In second subpixel 620, first organic spacer layer 650 protects emissive layer 648 from second overspray layer 652, which is disposed over emissive layer 648. There is not similar protection from overspray in third subpixel 660. This arrangement may be most useful for situations where impurities of the second and third emitting materials significantly degrades performance of devices that use the first emitting material, and impurities of the third emitting material significantly degrades performance of devices that use the second emitting material, but other combinations involving impurities of these materials do not significantly degrade device performance. For example, if first emitting material emits blue light (peak at 400-500 nm), second emitting material emits green light (peak at 500-600 nm), and third emitting material emits red light (peak at 600-700 nm), and the only significant effect that impurities have is due to transfer of triplets to materials having a lower triplet energy, the configuration of FIG. 6 would be preferred.

Device 600 is similar to device 400, but device 600 further includes a third subpixel.

Figure 7:
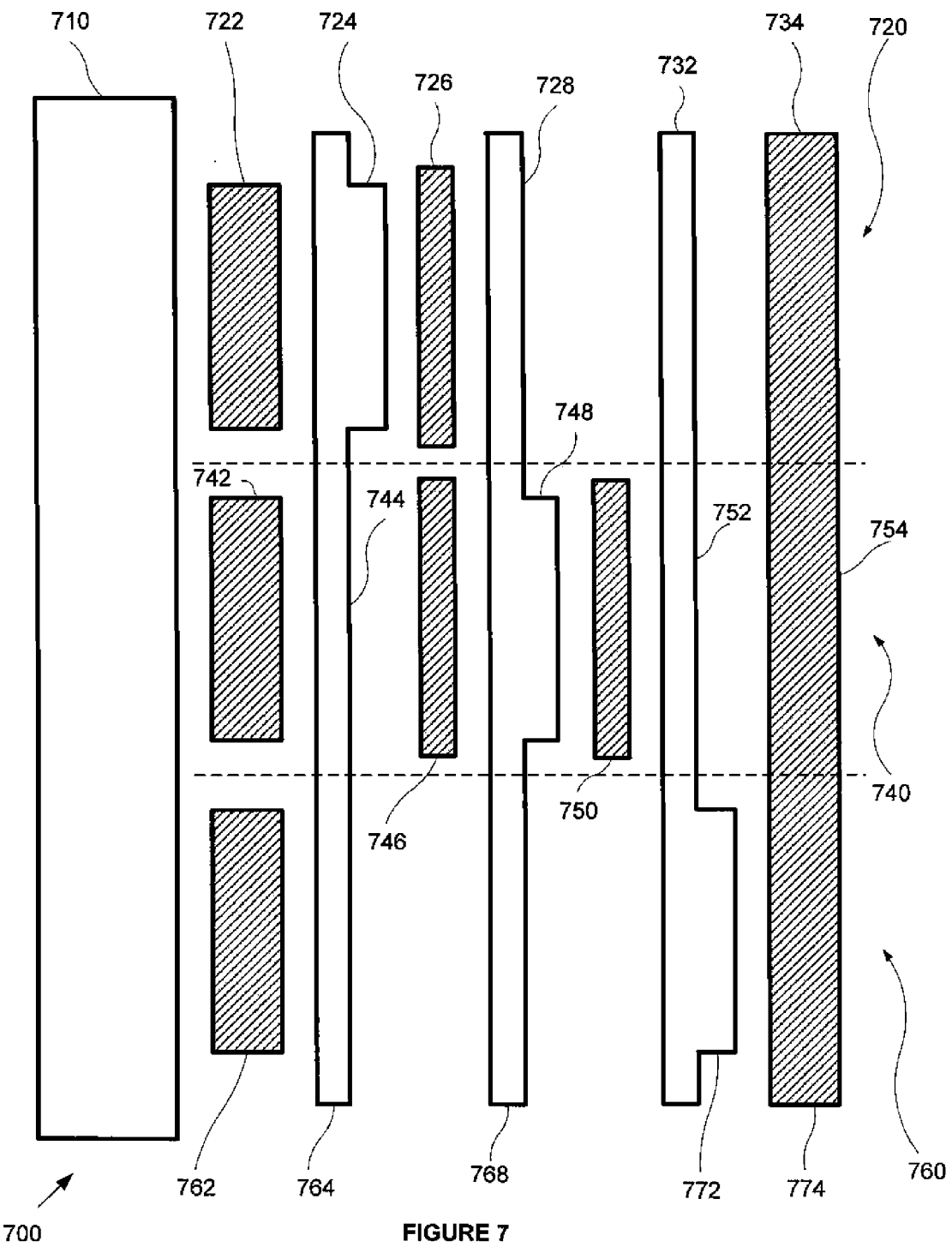
FIG. 7 shows a device having three subpixels, where two of the subpixels have organic spacer layers that protect an emissive layer from an overspray layer.

FIG. 7 shows a device having three subpixels, where two of the subpixels have organic spacer layers that protect an emissive layer from an overspray layer. In the first subpixel, an organic spacer layer protects an emissive layer from an overspray layer disposed above the emissive layer. In the second subpixel, a first organic spacer layer protects an emissive layer from an overspray layer disposed below the emissive layer, and a second organic spacer layer protects the emissive layer from an overspray layer disposed above the emissive layer. Device 700 is fabricated on substrate 710. Device 700 has a first subpixel 720, a second subpixel 740, and a third subpixel 740. A dashed line separates the subpixels. Hole and electron transport layers are not specifically illustrated in FIG. 7, but it is understood that they, and other layers, may be present. The illustration of FIG. 7 focuses on the emissive layers of the subpixels, the overspray layers created when those emissive layers are deposited, and organic spacer layers that provide protection from overspray.

First subpixel 720 includes a first electrode 722, an emissive layer 724, a first organic spacer layer 726, a first overspray layer 728, a second overspray layer 732, and a second electrode 734. Emissive layer 724 includes a first organic emitting material having a first emissive spectrum with a first peak in the visible spectrum.

Second subpixel 740 includes a first electrode 742, a first overspray layer 744, a first organic spacer layer 746, an emissive layer 748, a second organic spacer layer 750, a second overspray layer 752, and a second electrode 754. Emissive layer 748 includes a second organic emitting material, different from the first organic emitting material, having a second emissive spectrum with a second peak in the visible spectrum.

Third subpixel 760 includes a first electrode 762, a first overspray layer 764, a second overspray layer 768, an emissive layer 772, and a second electrode 774. Emissive layer 768 includes a third organic emitting material, different from the first and second organic emitting materials, having a third emissive spectrum with a third peak in the visible spectrum.

First overspray layer 744 of second subpixel 740, and first overspray layer 764 of third subpixel 760, are due to overspray when emissive layer 724 is deposited in first subpixel 720, and as a result include the first organic emitting material. Similarly, first overspray layer 728 of first subpixel 720, and second overspray layer 768 of third subpixel 760, are due to overspray when emissive layer 748 is deposited in second subpixel 740, and as a result include the second organic emitting material. Similarly, second overspray layer 732 of first subpixel 720, and second overspray layer 752 of second subpixel 740, are due to overspray when emissive layer 772 is deposited in third subpixel 760, and as a result include the third organic emitting material.

In device 700, in first subpixel 720, first organic spacer layer 726 protects emissive layer 724 from first overspray layer 728 and second overspray layer 732, which are disposed over emissive layer 724. In second subpixel 720, first organic spacer layer 746 protects emissive layer 748 from first overspray layer 744, which is disposed under emissive layer 748, and second organic spacer layer 750 protects emissive layer 748 from second overspray layer 752, which is disposed over emissive lauer 748. There is not similar protection from overspray in third subpixel 760. This arrangement may be most useful for situations where triplet considerations are present as described for a preferred use of the configuration of FIG. 6, but in addition where impurities of a green emitting material might also significantly degrade performance of a device using a blue emitting material, perhaps due to hole trapping on the green emitting material.

Device 700 is similar to device 600, but device 700 includes an additional organic spacer layer in the second subpixel.

It is understood that many other configurations involving the use of organic spacer layers to protect emissive layers from overspray are possible. For example, in FIG. 7, there are four locations where, in the absence of an organic spacer layer, an emissive layer would be in contact with an overspray layer resulting from the deposition of a nearby emissive layer. Organic spacer layers are present in three of these locations—specifically, first organic spacer layer 726 of first subpixel 720, and first organic spacer layer 746 and second organic spacer layer 752 of second subpixel 740. The fourth location is between emissive layer 772 of third subpixel 760, and second overspray layer 768 of third subpixel 760. Depending on the particular materials used in each emissive layer, and whether overspray from nearby emissive layers has a significant detrimental affect on device performance, organic spacer layers may be used in any combination of these positions.

For example, devices using blue emitting materials may be the most vulnerable to significant degradation due to impurities. Many of the examples assume that the blue emissive layer is deposited first (i.e., it is in first subpixel 720). However, this is not necessarily the case. The emitting layers may be deposited in any order, and the blue emitting material may be in third subpixel 760, in which case an underlying organic spacer layer may be preferred.

In addition, various emitting materials interact in various ways, and triplet transfer may not be the only mechanism that adversely affects device performance when impurities of one emitting material are present in the emissive layer of a nearby device that uses a different emitting material. Any time that such impurities are present due to overspray, an organic spacer layer may be used to prevent the overspray from contacting the emissive layer.

Devices were fabricated to demonstrate the effect of spacer layers on device performance where overspray layers are present. This experiment was performed in a conventional vacuum thermal evaporation (VTE) chamber to assess the effects of a thin layer of overspray contamination on the properties of red, green and blue (R,G,B) OLEDs and to what extent these effects can be reduced by utilizing a system of ROB pixels with spacer layers. It was desired to compare the effect of contamination on devices with spacer layers to contamination in devices without spacer layers, where the contamination was reproducible. Because it is difficult to control the thickness of a deliberately-introduced contamination layer having a thickness below 5 A, the devices were fabricated by vacuum thermal evaporation (VIE), not by OVJP. The thin contamination layers, deliberately and separately deposited by VTE, are not technically "overspray," and may be referred to as a "simulated" overspray layer. These simulated overspray layers were about 5 A thick, because it is difficult to control the thickness of layers thinner than 5 A even with VTE. While a 5 A thick layer deposited by VTE is much thicker than the sub-monolayer thickness expected from an OVJP overspray layer, the experiment has value in illustrating how the strategic use of spacer layers can ameliorate even excessive contamination. Actual contamination in OVJP conditions is expected to be easier to address.

The emissive layers were deposited in the sequence B-G-R, which is expected to naturally minimize the negative effects of overspray by keeping lower energy (longer wavelength) emitters away from each recombination zone. If the thin blue, green and red contamination layers is represented by b-g-r, respectively, and the actual emissive layers are represented by B-G-R, then the above deposition sequence is expected to result in the structures B-g-r at the blue pixel, b-G-r at the green pixel and b-g-R at the red pixel. The contamination effects would be addressed by depositing a spacer layer specifically optimized for blue devices (Bs) above the B layer and a spacer layer specifically optimized for green devices (Gs) above the G layer, resulting in the structures B-Bs-g-r at the blue pixel, b-G-Gs-r at the green pixel and b-g-R at the red pixel. This is basically the structure illustrated in FIG. 6, where subpixel 620 is blue, subpixel 640 is green, and subpixel 660 is red. Note that in actual OVJP deposition the spacer layers are also expected to overspray but this is not taken account of here because it is expected that contamination of an emissive layer with the materials of the spacer layers will be relatively benign when compared to contamination with the materials of other emissive layers.

For blue and green, four devices for each color were fabricated. A "Pixel Structure 1" included simulated overspray layers where overspray is shown in FIG. 6, but did not include spacer layers. A "Pixel Structure 2" was similar to "Pixel Structure 1," but also included spacer layers where shown in FIG. 6. A "Standalone Pixel, no spacer" was similar to Pixel Structure 1 but without overspray (i.e., no overspray, no spacer). A "Standalone Pixel, spacer" was similar to Pixel Structure 2 but without overspray (i.e., no overspray, but the spacers were included to allow). It is expected that a comparison of Pixel Structure 2 to Pixel Structure 1 will show whether spacers reduce issues caused by the simulated overspray, and that the Standalone Pixels can be used to isolate what effect the spacer layers have absent overspray, so that the effect of the spacer layers on overspray contamination can be isolated.

The following materials were used in devices fabricated to illustrate concepts.

Percentages are weight percentage.

anode—indium tin oxide hole injection layer—Compound 1, 100 A hole transport layer—N,N'-di(1-naphthyl)-N,N'-diphenyl-benzidine (α-NPD), 300 A blue emissive layer host:dopant (B)—Compound 2:Compound 3 (18%), 300 A blue simulated overspray layer (b)—same materials as blue emissive layer, but 5 A thick blue spacer layer (Bs)—Compound 2 (50 A)

green emissive layer host:dopant (G)—Compound 4:Compound 5 (20%), 300 A green simulated overspray layer (g)—same materials as green emissive layer, but 5 A thick green spacer layer (Gs)—Compound 4 (100 A)

red emissive layer host:dopant (R)—Compound 4:Compound 6 (15%), 300 A red simulated overspray layer (r)—same materials as red emissive layer, but 5 A thick electron transport layer—tris(8-hydroxyquinoline) aluminum ($Alq_3$)

cathode LiF, 10 A/Al, 1000 A

Compound 1

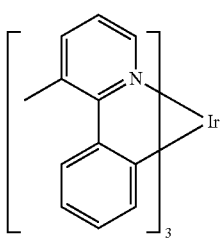

Compound 2

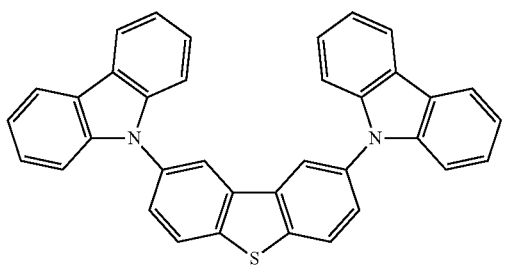

Compound 3

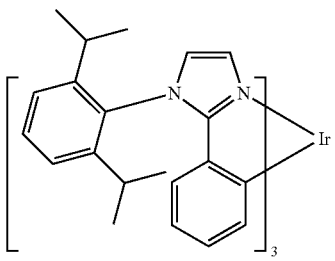

Compound 5

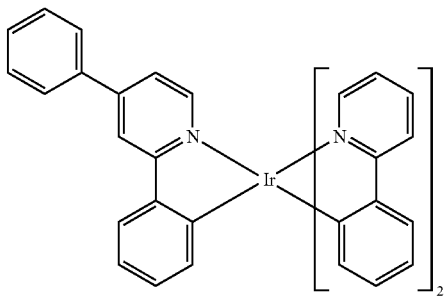

Compound 6

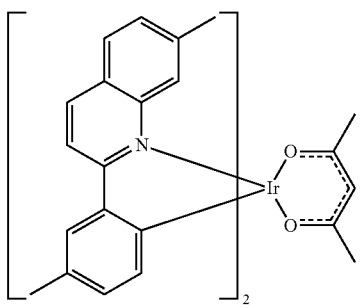

Compound 4 was NS60, available for purchase from Nippon Steel Company.

The devices all had the same anode, hole injection layer, hole transport layer, electron transport layer and cathode, with the differences being in the emissive layers, overspray layers and spacer layers located between the hole transport and electron transport layers. The common layers were as follows: ITO (cathode)/Compound 1, 100 A (hole injection layer)/NPD, 300 A (hole transport layer)/SEE BELOW/$Alq_3$, 400 A (electron transport layer)/(LIF, 10 A/Al, 1000 A), cathode.

The emissive layers, overspray layers and spacer layers between the hole transport layer and the electron transport layer were as follows:

Blue Pixel Structure 1: B/g/r
Blue Pixel Structure 2: B/Bs/g/r
Blue Standalone, no spacer: B
Blue Standalone, spacer: B/Bs
Green Pixel Structure 1: b/G/r
Green Pixel Structure 2: b/G/Gs/r
Green Standalone, no spacer: G
Green Standalone, spacer: G/Gs
Red Pixel Structure 1: b/g/R
Red Pixel Structure 2: not made because no spacer used for red in this example
Red Standalone, no spacer: R
Red Standalone, spacer: not made because no spacer used for red in this example For each device, voltage luminous efficiency and emissive spectra (reported as CIE coordinates) were measured at 1000 $cd/m^2$. The results are shown in Table 1.

TABLE 1

| Device | Voltage (V) | Luminous Efficiency (cd/A) | 1931 CIE x | 1931 CIE y |
|---|---|---|---|---|
| Blue Pixel Structure 1 | 6.4 | 12.4 | 0.212 | 0.392 |
| Blue Pixel Structure 2 | 5.5 | 40.8 | 0.182 | 0.406 |
| Standalone Blue Pixel, no spacer layer | 6.0 | 14.1 | 0.176 | 0.384 |
| Standalone Blue Pixel with spacer layer | 5.3 | 43.2 | 0.179 | 0.400 |
| Green Pixel Structure 1 | 4.4 | 27.8 | 0.454 | 0.534 |
| Green Pixel Structure 2 | 4.4 | 50.8 | 0.447 | 0.541 |
| Standalone Green Pixel, no spacer layer | 3.6 | 39.5 | 0.450 | 0.538 |
| Standalone Green Pixel with spacer layer | 3.7 | 60.5 | 0.445 | 0.543 |
| Red Pixel Structure 1 | 5.4 | 14.2 | 0.643 | 0.355 |
| Red Pixel Structure 2 | n/a | n/a | n/a | n/a |
| Standalone Red Pixel no spacer layer | 5.5 | 10.6 | 0.647 | 0.351 |

Blue Devices: Without the spacer layer, the effect of the contamination layers (Blue Pixel Structure 1) compared to the performance of the Standalone Blue Pixel, no spacer, is a voltage increase of 0.4V (from 6 to 6.4V) and an efficiency decrease of 12% (from 14.1 to 12.4 cd/A). Significant red/green contamination is seen in the CIE coordinates of Blue Pixel Structure 1. With the spacer layer (Blue Pixel Structure 2), compared to the performance of the Blue Standalone Pixel, spacer, the voltage increases by only 0.2V (5.3 to 5.5V) and the efficiency decreases by only 5.6% (43.2 to 40.8 cd/A). Spectral contamination is much less.

Green Pixel: Without the spacer layer (compare Green Pixel Structure 1 to Standalone Green Pixel, no spacer) the effect of the contamination layers in a voltage increase of 0.8 V (from 3.6 to 4.4 V) and an efficiency decrease of 30% (39.5 to 27.8 cd/A). There was a slight broadening of the emission spectrum on the red side, which is reflected in the 0.004 difference in the x and y CIE coordinates. With the spacer layer, (compare Green Pixel Structure 2 to Standalone Green Pixel, spacer) the voltage increases by 0.7 V (3.7 to 4.4 V) and the efficiency decreases by 16% (60.5 to 50.8 cd/A). Spectral contamination was less.

Red Pixel: No blocking layer is used in the red devices. The contamination layers induce a voltage decrease of 0.1V (5.5 to 5.4 V) although this is probably within the error of the measurement. The contamination layers also induce an efficiency increase of 30% to 34% depending on the sequence of the contamination layers (10.6 to 14.2 cd/A).

These results show that the structure incorporating the spacer layers and contamination layers produce better results than structures with the contamination layers alone.

Another experiment was performed to illustrate that contamination due to overspray can significantly degrade device performance.

Figure 8:
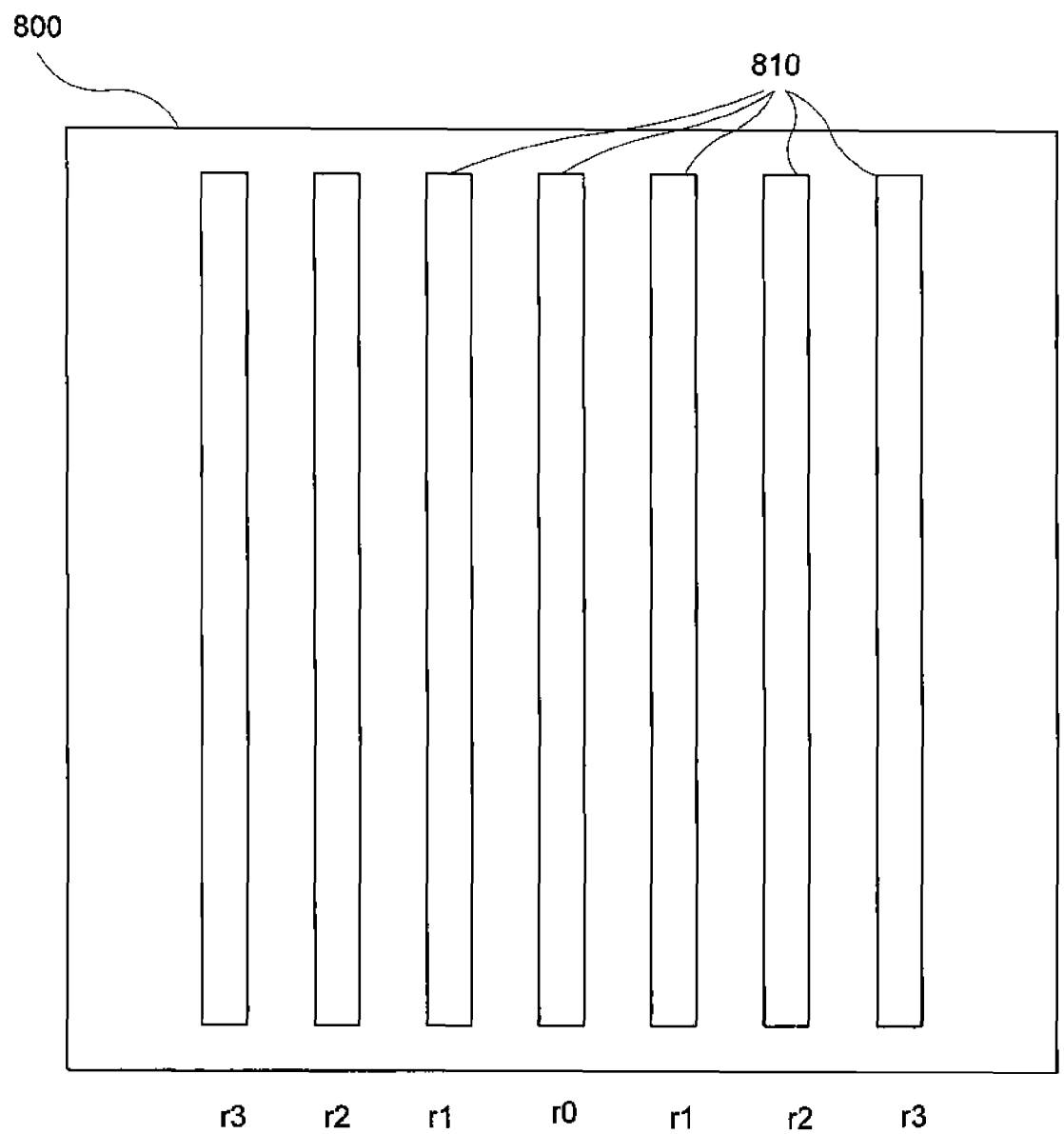
FIG. 8 shows a series of devices used to illustrate issues with devices caused by overspray.

FIG. 8 shows a series of devices used to illustrate issues with devices caused by overspray. On a substrate 800, several devices 810 were fabricated. The devices were in the shape of lines. Each line was 1 mm wide, and the separation between lines was 1.5 mm. A total of 13 lines were fabricated, although only the middle 7 lines illustrated in FIG. 8. The middle line is labeled r0, and each pair of lines moving outward are numbered r1, r2, r3, r4, r5 and r6. Substrate 800 was a 6 inch by 6 inch glass substrate, having lines of indium tin oxide patterned thereon. α-NPD (N,N'-di(1-naphthyl)-N,N'-diphenylbenzidine) was blanket deposited over the indium tin oxide using VTE to a thickness of 400 A. Then, a single line of Compound 7 was printed over line r0 using OVJP. The nozzle had an inside diameter of 1 mm, and was passed along the length of line r0 at a speed of 8 mm/s and a distance of 1 mm. Compound 7 was not deliberately deposited on lines r1-r6, but neither were they masked during the deposition onto line r0, such that they may receive some deposition of Compound 7 due to overspray. Then, 2,9-dimethyl-4,7-diphenyl-1,10-phenanthroline (BCP) was blanket deposited using VTE to a thickness of 400 A. A top electrode of LiF (12 A) and Al (1000 A) was then deposited over the BCP. Compound 7 has the structure:

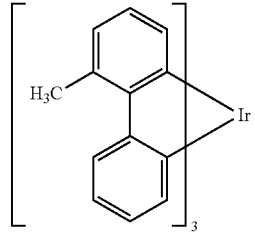

In the devices described with respect to FIG. 8, it is expected that the device at r0 will exhibit green emission from Compound 1, which is a green phosphorescent emitter. In the absence of overspray issues, it is expected that devices at r1-r6 will exhibit blue emission from the α-NPD.

Figure 9:
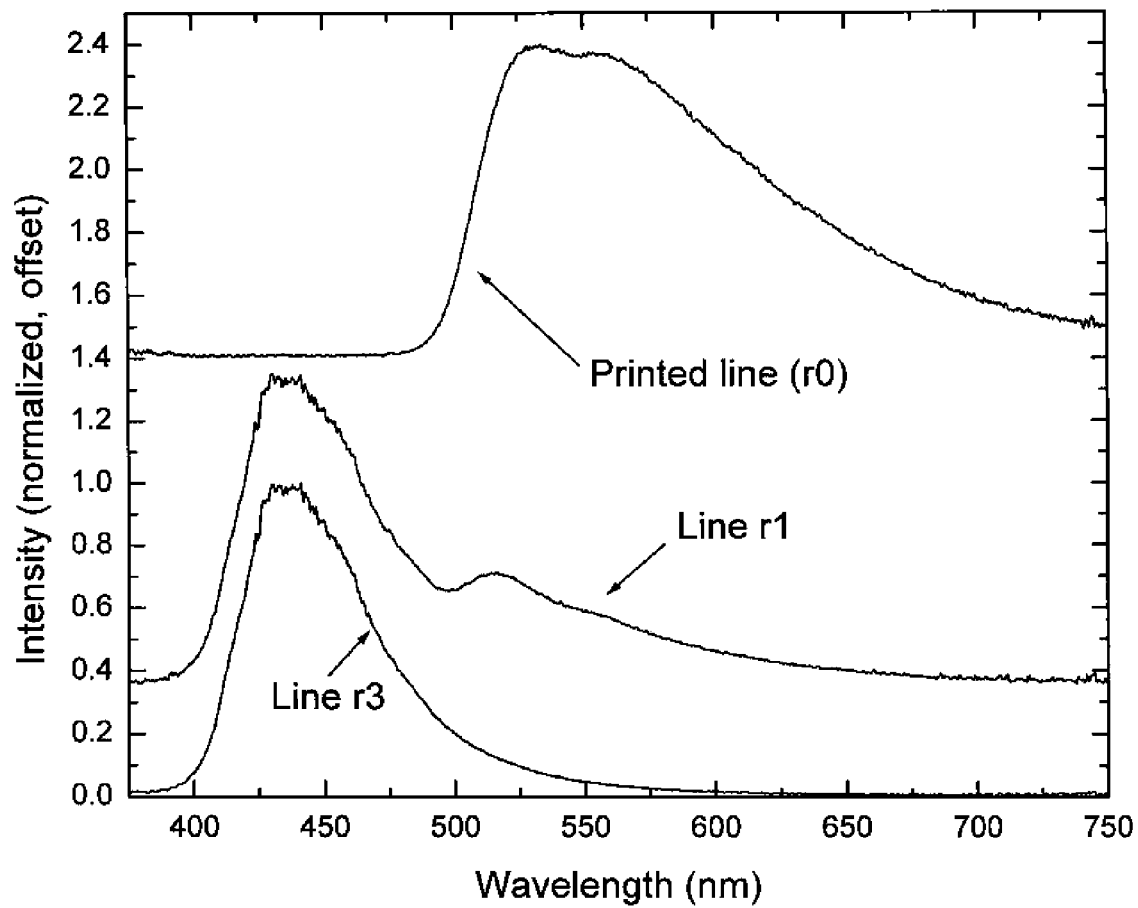
FIG. 9 shows emission spectra from some of the devices of FIG. 8.

FIG. 9 shows the emission spectra from lines r0, r1 and r3 of FIG. 8. The spectra are normalized to have a height of 1, and are offset. The emission from line r0 has a peak at about 530 nm, which is consistent with emission from Compound 1. The spectrum for line r1 shows a peak at about 430 nm, and a lesser peak at about 525 nm. This spectrum is consistent with emission from α-NPD contaminated with Compound 1, even though no Compound 1 was deliberately deposited onto line r1, but may be present due to overspray. The spectrum for line r3 shows a peak at 430 nm, but does not show the peak at 525 that was observed for r1. The spectrum of line r3 is consistent with emission from α-NPD either not contaminated with Compound 1, or contaminated much less than line r1. This is consistent with the overspray of Compound 1 from line r0 having a smaller effect as distance from line r0 increases.

FIGS. 8 and 9 illustrate that overspray can cause significant contamination and can alter the performance of nearby devices.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A first device comprising a multicolor organic light emitting device, further comprising:
   a first subpixel, further comprising:
      a first electrode of the first subpixel;
      a second electrode of the first subpixel;
      an emissive layer of the first subpixel disposed between the first electrode of the first subpixel and the second electrode of the first subpixel, the emissive layer of the first subpixel further comprising a first organic emitting material having a first emissive spectrum with a first peak in the visible spectrum;
a first overspray layer of the first subpixel disposed between the first electrode of the first subpixel and the second electrode of the first subpixel, the first overspray layer of the first subpixel further comprising a second organic emitting material, different from the first organic emitting material, the second organic emitting material having a second emissive spectrum with a second peak in the visible spectrum;
a first organic spacer layer of the first subpixel disposed between first emissive layer of the first subpixel and the second overspray layer of the first subpixel;
a second subpixel, further comprising:
a first electrode of the second subpixel;
a second electrode of the second subpixel;
a first overspray layer of the second subpixel disposed between the first electrode of the second subpixel and the second electrode of the second subpixel, the first overspray layer of the second subpixel further comprising the first organic emitting material;
an emissive layer of the second subpixel disposed between the first electrode of the second subpixel and the second electrode of the second subpixel, the emissive layer of the second subpixel further comprising the second organic emitting material,
wherein, the first overspray layer of the first subpixel is thinner than the emissive layer of the second subpixel, and the first overspray layer of the second subpixel is thinner than the emissive layer of the first subpixel.

2. The first device of claim 1, wherein:
the first subpixel comprises:
the first electrode of the first subpixel;
the emissive layer of the first subpixel disposed over the first electrode;
the first spacer layer of the first subpixel disposed over the emissive layer of the first subpixel;
the first overspray layer of the first subpixel disposed over the first spacer layer of the first subpixel;
the second electrode of the first subpixel disposed over the first overspray layer of the first subpixel;
the second subpixel comprises:
the first electrode of the second subpixel;
the first overspray layer of the second subpixel disposed over the first electrode of the second subpixel;
the emissive layer of the second subpixel disposed over the first overspray layer of the second subpixel;
the second electrode of the second subpixel disposed over the emissive layer of the second subpixel.

3. The first device of claim 2, wherein:
in the first subpixel:
the first spacer layer of the first subpixel is in contact with the emissive layer of the first subpixel;
the first overspray layer of the first subpixel is in contact with the first spacer layer of the first subpixel.

4. The first device of claim 1, wherein:
the first subpixel comprises:
the first electrode of the first subpixel;
the first overspray layer of the first subpixel disposed over the first electrode of the first subpixel;
the first spacer layer of the first subpixel disposed over the first overspray layer of the first subpixel;
the emissive layer of the first subpixel disposed over the first spacer layer;
the second electrode of the first subpixel disposed over the emissive layer of the first subpixel;
the second subpixel comprises:
the first electrode of the second subpixel;
the emissive layer of the second subpixel disposed over the first electrode of the second subpixel;
the first overspray layer of the second subpixel disposed over the emissive layer of the second subpixel;
the second electrode of the second subpixel disposed over the first overspray layer of the second subpixel.

5. The first device of claim 4, wherein:
in the first subpixel:
the first spacer layer of the first subpixel is in contact with the first overspray layer of the first subpixel;
the emissive layer of the first subpixel is in contact with the first spacer layer.

6. The first device of claim 1, wherein:
the first subpixel further comprises:
the first electrode of the first subpixel;
the emissive layer of the first subpixel disposed over the first electrode of the first subpixel;
the first organic spacer layer of the first subpixel disposed over the emissive layer of the first subpixel;
the first overspray layer of the first subpixel disposed over the first organic spacer layer of the first subpixel;
a second overspray layer of the first subpixel disposed over the first overspray layer of the first subpixel, the second overspray layer of the first subpixel further comprising a third organic emitting material, different from the first organic emitting material and the second organic emitting material, the third organic emitting material having a third emissive spectrum with a third peak in the visible spectrum;
the second electrode of the first subpixel disposed over the second overspray layer of the first subpixel;
the second subpixel further comprises:
the first electrode of the second subpixel;
the first overspray layer of the second subpixel disposed over the first electrode of the second subpixel;
the emissive layer of the second subpixel disposed over the first overspray layer of the second subpixel;
the first organic spacer layer of the second subpixel disposed over the emissive layer of the second subpixel;
a second overspray layer of the second subpixel disposed over the first overspray layer of the second subpixel, the second overspray layer of the second subpixel further comprising the third organic emitting material;
the second electrode of the second subpixel disposed over the second overspray layer of the second subpixel;
wherein the multicolor organic light emitting device further comprises a third subpixel, the third subpixel further comprising:
a first electrode of the third subpixel;
a first overspray layer of the third subpixel disposed over the first electrode of the third subpixel, the first overspray layer of the third subpixel comprising the first emissive material;
a second overspray layer of the third subpixel disposed over the first overspray layer of the third pixel, the second overspray layer of the third subpixel comprising the second emissive material;
an emissive layer of the third subpixel disposed over the second overspray layer of the third subpixel, the emissive layer of the third subpixel comprising the third organic emitting material;

a second electrode of the third subpixel disposed over the emissive layer of the third subpixel.

7. The first device of claim 1, wherein:
the first subpixel further comprises:
the first electrode of the first subpixel;
the emissive layer of the first subpixel disposed over the first electrode of the first subpixel;
the first organic spacer layer of the first subpixel disposed over the emissive layer of the first subpixel;
the first overspray layer of the first subpixel disposed over the first organic spacer layer of the first subpixel;
a second overspray layer of the first subpixel disposed over the first overspray layer of the first subpixel, the second overspray layer of the first subpixel further comprising a third organic emitting material, different from the first organic emitting material and the second organic emitting material, the third organic emitting material having a third emissive spectrum with a third peak in the visible spectrum;
the second electrode of the first subpixel disposed over the second overspray layer of the first subpixel;
the second subpixel further comprises:
the first electrode of the second subpixel;
the first overspray layer of the second subpixel disposed over the first electrode of the second subpixel;
the first organic spacer layer of the second subpixel disposed over the first overspray layer of the second subpixel;
the emissive layer of the second subpixel disposed over the first organic spacer layer of the second subpixel;
a second organic spacer layer of the second subpixel disposed over the emissive layer of the second subpixel;
a second overspray layer of the second subpixel disposed over the second organic spacer layer of the second subpixel, the second overspray layer of the second subpixel further comprising the third organic emitting material;
the second electrode of the second subpixel disposed over the second overspray layer of the second subpixel;
wherein the multicolor organic light emitting device further comprises a third subpixel, the third subpixel further comprising:
a first electrode of the third subpixel;
a first overspray layer of the third subpixel disposed over the first electrode of the third subpixel, the first overspray layer of the third subpixel comprising the first emissive material;
a second overspray layer of the third subpixel disposed over the first overspray layer of the third pixel, the second overspray layer of the third subpixel comprising the second emissive material;
an emissive layer of the third subpixel disposed over the second overspray layer of the third subpixel, the emissive layer of the third subpixel comprising the third organic emitting material;
a second electrode of the third subpixel disposed over the emissive layer of the third subpixel.

8. The first device of claim 6, wherein the first, second and third subpixels are separately addressable.

9. The first device of claim 6, wherein:
the first electrode of the first subpixel, the first electrode of the second subpixel and the first electrode of the third subpixel are anodes;
the second electrode of the first subpixel, the second electrode of the second subpixel and the second electrode of the third subpixel are cathodes;
the device further comprises a hole transport layer common to the first, second and third subpixels, wherein the hole transport layer is disposed between the first electrode of the first subpixel and the emissive layer of the first subpixel in the first subpixel, between the first electrode of the second subpixel and the first overspray layer of the second subpixel in the second subpixel, and between the first electrode of the third subpixel and the first overspray layer of the third subpixel in the third subpixel.

10. The first device of claim 6, wherein:
the first electrode of the first subpixel, the first electrode of the second subpixel and the first electrode of the third subpixel are anodes;
the second electrode of the first subpixel, the second electrode of the second subpixel and the second electrode of the third subpixel are cathodes;
the device further comprises an electron transport layer common to the first, second and third subpixels, wherein the electron transport layer is disposed between the second electrode of the first subpixel and the second overspray layer of the first subpixel in the first subpixel, between the second electrode of the second subpixel and the second overspray layer of the second subpixel in the second subpixel, and between the second electrode of the third subpixel and the emissive layer of the third subpixel in the third subpixel.

11. The first device of claim 6, wherein the first peak is between 400 and 500 nm, the second peak is between 500 and 600 nm, and the third peak is between 600 and 700 nm.

12. The first device of claim 1, wherein the first device is a consumer device.

13. A method of depositing a first device comprising a multi-color organic light emitting device having first and second subpixels, comprising:
providing a first electrode of the first subpixel, and a first electrode of the second subpixel;
depositing over the first electrode of the first subpixel and the first electrode of the second subpixel, in order:
a layer comprising a first emitting material having an emissive spectrum with a first peak in the visible spectrum, the layer being deposited via organic vapor jet deposition with the jet positioned such that a first emissive layer is formed in the first subpixel, and a first overspray layer is formed in the second subpixel;
a first blocking layer over at least one of the first and second subpixels;
a layer comprising a second emitting material having an emissive spectrum with a second peak in the visible spectrum, different from the first peak the layer being deposited via organic vapor jet deposition with the jet positioned such that a second emissive layer is formed in the second subpixel, and a second overspray layer is formed in the first subpixel;
depositing a second electrode over the layer comprising the second emitting material,
wherein, the first overspray layer of the second subpixel is thinner than the first emissive layer of the first subpixel, and the second overspray layer of the first subpixel is thinner than the second emissive layer of the second subpixel.

14. The method of claim 13, wherein the multi-color organic light emitting device has first, second and third subpixels, and the method further comprises:

providing a first electrode of the third subpixel in addition to the first electrode of the first subpixel, and the first electrode of the second subpixel;

wherein the deposition, in order, is over the first electrode of the first subpixel, the first electrode of the second subpixel, and the first electrode of the third subpixel, wherein, during deposition of the layer comprising the first emitting material, the first overspray layer is also formed in the third subpixel;

wherein, during deposition of the layer comprising a second emitting material, a second overspray layer is also formed in the third subpixel;

wherein the deposition further comprises depositing, in order and after depositing the layer comprising a second emitting material and before depositing the second electrode, a second blocking layer in the second subpixel;

a layer comprising a third emitting material having an emissive spectrum with a third peak in the visible spectrum, different from the first and second peaks, the jet being positioned such that a third emissive layer is formed in the third subpixel, and a third overspray layer is formed in the first and second subpixels.

15. The method of claim 14, wherein the first peak is between 400 and 500 nm, the second peak is between 500 and 600 nm, and the third peak is between 600 and 700 nm.

* * * * *